(12) United States Patent
Ranucci

(10) Patent No.: US 7,511,645 B1
(45) Date of Patent: Mar. 31, 2009

(54) APPARATUS AND METHOD FOR AUTO-ZEROING A SAMPLED COMPARATOR

(75) Inventor: Paul D. Ranucci, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 5 days.

(21) Appl. No.: 11/728,753

(22) Filed: Mar. 27, 2007

(51) Int. Cl.
*H03M 1/10* (2006.01)

(52) U.S. Cl. .................. 341/120; 341/118; 341/119; 341/121; 341/154; 341/155

(58) Field of Classification Search ......... 341/118–121, 341/155, 154
See application file for complete search history.

(56) References Cited

U.S. PATENT DOCUMENTS

| | | | | |
|---|---|---|---|---|
| 4,580,126 | A * | 4/1986 | Kato et al. ............... | 341/120 |
| 5,235,333 | A * | 8/1993 | Naylor et al. ............ | 341/118 |
| 5,283,504 | A * | 2/1994 | Chauvin et al. .......... | 315/370 |
| 5,635,934 | A | 6/1997 | Brown | |
| 5,661,481 | A * | 8/1997 | Muramatsu ............... | 341/120 |
| 6,268,813 | B1 * | 7/2001 | de Wit .................... | 341/120 |
| 6,625,232 | B1 | 9/2003 | Tilley | |
| 6,703,885 | B1 * | 3/2004 | Fan et al. ................. | 327/308 |
| 6,725,018 | B1 * | 4/2004 | Gross, Jr. ................ | 455/67.13 |
| 6,798,827 | B1 | 9/2004 | Phanse | |
| 6,822,501 | B2 * | 11/2004 | Kinugasa ................. | 327/307 |
| 6,917,324 | B2 * | 7/2005 | Lee ......................... | 341/155 |
| 7,221,918 | B1 | 5/2007 | Grasbeck et al. | |
| 7,336,214 | B2 * | 2/2008 | Krymski ................. | 341/172 |
| 7,352,307 | B2 * | 4/2008 | Iorgulescu ............... | 341/118 |
| 2006/0073803 | A1 * | 4/2006 | Igarashi et al. .......... | 455/296 |
| 2006/0267637 | A1 * | 11/2006 | Umemura et al. ........ | 327/77 |

OTHER PUBLICATIONS

Ayal Shoval et al., "Median-Based Offset Cancellation Circuit Technique," 1992, IEEE, pp. 2033-2036.
George Kottaras et al., "A 10 bit, low power, digitally auto-zeroed CMOS Analoque to Digital Converter Core for the NASA TRIO Smart Sensor System on a Chip," ESSCIRC 2002, pp. 711-714.
Matthias Frey et al., "On the Static Resolution of Digitally Corrected Analog-to Digital and Digital-to-Analog Converters with Low-Precision Components," IEEE Transactions on Circuits and Systems-I: Regular Papers, vol. 54, No. 1, Jan. 2007, pp. 229-237.
Xiaofeng Wang et al., "A Robust Offset Cancellation Scheme for Analog Multipliers," 2004 IEEE, pp. 326-329.

(Continued)

*Primary Examiner*—Linh V Nguyen

(57) ABSTRACT

A comparator compares an input voltage and a reference voltage and generates an output based on the comparison. The comparator may receive the input voltage in a normal mode of operation. Voltage band circuitry provides first and second test voltages to the comparator. The test voltages define a band around the reference voltage. An integrator adjusts an offset correction signal provided to the comparator based on outputs of the comparator that are generated using the test voltages. The output of the comparator that is generated using the first test voltage could be generated during a first auto-zeroing cycle. The output of the comparator that is generated using the second test voltage could be generated during a second auto-zeroing cycle. This technique helps to maintain the offset of the comparator with the band around the reference voltage.

20 Claims, 3 Drawing Sheets

OTHER PUBLICATIONS

James H. Atherton et al., "An Offset Reduction Technique for Use with CMOS Integrated Comparators and Amplifiers," IEEE Journal of Solid-State Circuits, vol. 27, No. 8, Aug. 1992, pp. 1168-1175.

Hiroyuki Okada et al., "Offset Calibrating Comparator Array for 1.2-V, 6-bit, 4-Gsample/s Flash ADCs using 0.13-um generic CMOS technology," 2003 IEEE, pp. 711-714.

Ari Juhani Grasbeck et al., U.S. Appl. No. 10/638,959, filed Aug. 11, 2003, Entitled "Digital DC-Offset Correction Circuit for an RF Receiver."

Paul Michael Henry, U.S. Appl. No. 11/124,758, filed May 9, 2005, Entitled "System and Method for Providing an Offset Voltage Minimization Circuit."

Vladislav Potanin et al., "Balanced Offset Compensation Circuit", no date.

Michiel Pertijs et al., "Autozeroing Current Feedback Instrumentation Amplifier", no date.

Paul M. Henry, "System and Method for Providing an Offset Voltage Minimization Circuit", U.S. Appl. No. 11/124,758, filed May 9, 2005.

* cited by examiner

APPARATUS AND METHOD FOR AUTO-ZEROING A SAMPLED COMPARATOR

TECHNICAL FIELD

This disclosure is generally directed to comparison circuits and more specifically to an apparatus and method for auto-zeroing a sampled comparator.

BACKGROUND

Comparators are used widely in electronics, including in demanding applications such as analog-to-digital converters, clocks, and sensors. Speed, accuracy, and power consumption are often important parameters in comparator design. In many cases, all three parameters need to be optimized at once. The direct current (DC) accuracy of a comparator is often determined by its systematic and random offsets.

Systematic offsets can usually be minimized by gain and topology, but random offsets are often a result of process variations. Process variations can often be minimized by increasing the area of a device, but this also typically increases parasitic capacitances in the device. This often creates a trade-off between speed, power, and accuracy. An alternative to increasing the size of a device is to use offset cancellation or auto-zeroing techniques. This can eliminate the need for large devices and may allow a comparator to be optimized for speed and power consumption without sacrificing accuracy.

Various offset cancellation techniques have been developed and used. However, each of these techniques typically suffers from one or more drawbacks. For example, some techniques use storage capacitors that sample a comparator's offset during times when the comparator is not needed (referred to as "off-time"). These storage capacitors then hold a voltage associated with the offset when the comparator is in use to cancel out the offset. However, storage capacitors often require large areas, create residual offsets due to charge coupling from switches onto the capacitors, and permit leakage of charge from the capacitors.

Other offset cancellation techniques take advantage of the digital output of a comparator and implement a digital offset cancellation scheme. A conventional offset cancellation circuit 100 is shown in FIG. 1. The circuit 100 includes a comparator 102, a latch 104, a counter 106, and a digital-to-analog converter (DAC) 108. During auto-zeroing, a switch 110 is closed to force both inputs of the comparator 102 to the same value. The latch 104 samples the output of the comparator 102, and the counter 106 increments or decrements its output depending on the latched value. The output of the counter 106 is provided to the DAC 108, which generates an analog offset correction signal that is supplied to an analog offset adjust within the comparator 102. This process can continue until the current offset of the comparator 102 is identified and corrected. An auto-zeroing clock controls the operations of various components in the circuit 100 during auto-zeroing.

In this way, the comparator 102 can be zeroed to within one least significant bit of the DAC 108. However, an inherent digital oscillation typically appears when the DAC 108 nears the point at which the comparator 102 has zero offset. When this point is neared or reached, the counter 106 typically bounces back and forth between a slightly positive offset and a slightly negative offset. For some applications, this oscillation may be acceptable. For other applications, such as applications where the comparator's threshold needs to be consistent, this oscillation is often unacceptable. For example, if the comparator 102 is used in a clock circuit, every cycle of the digital oscillation can lead to jitter in the clock frequency or duty cycle.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
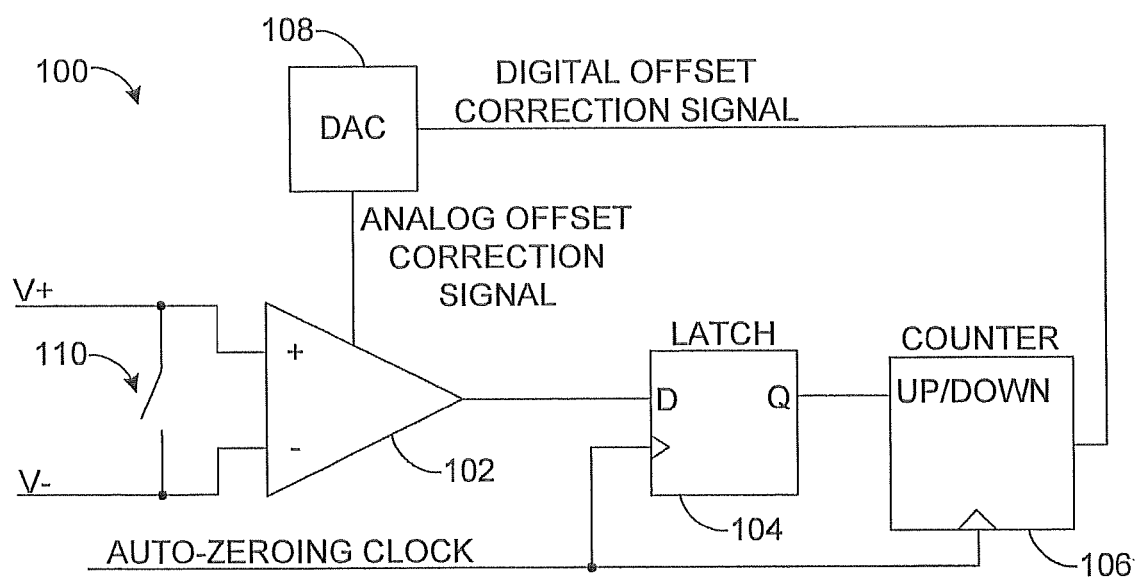
FIG. 1 illustrates a conventional offset cancellation circuit for a sampled comparator.
Figure 2:
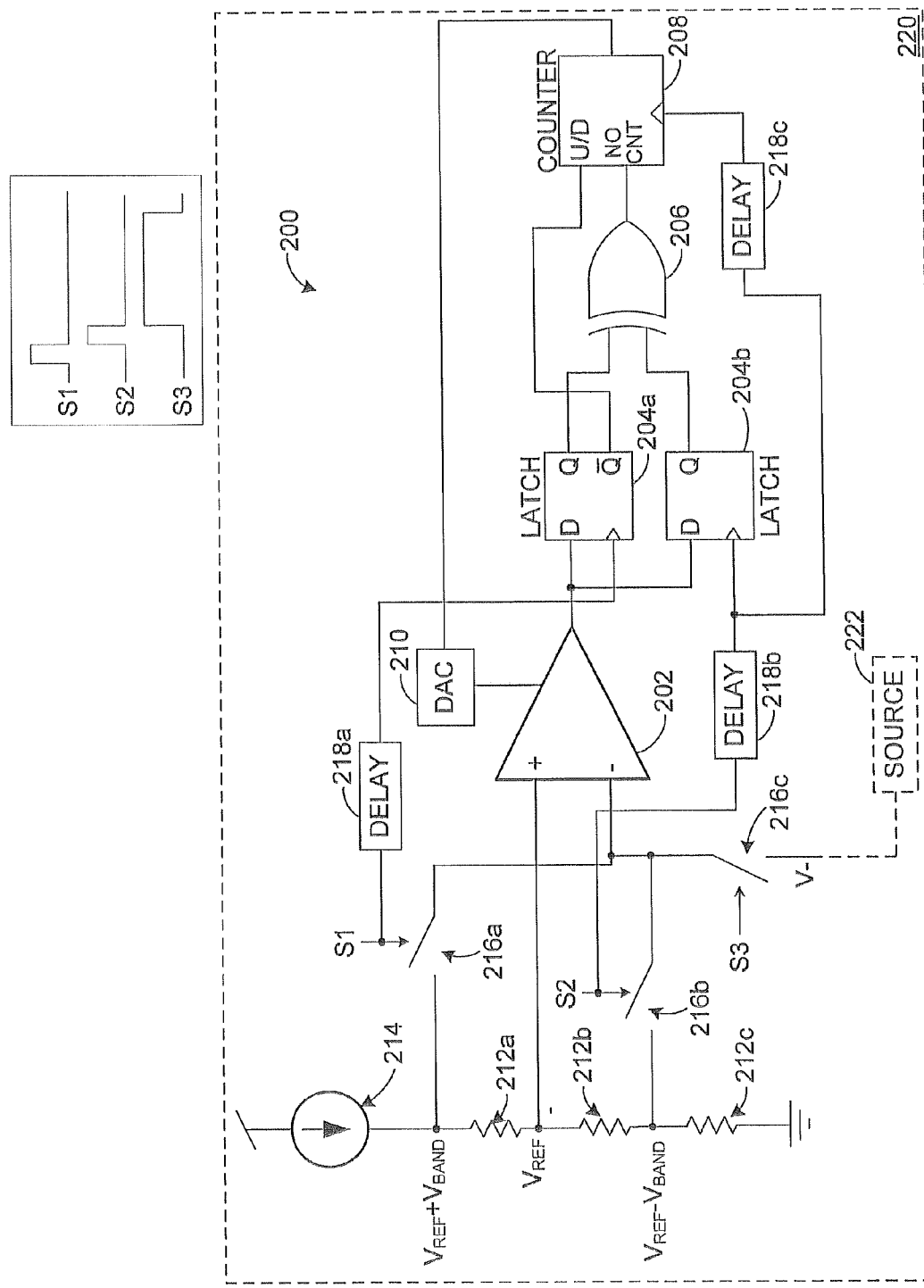
FIG. 2 illustrates an example circuit for offset cancellation of a sampled comparator in accordance with this disclosure.
Figure 3:
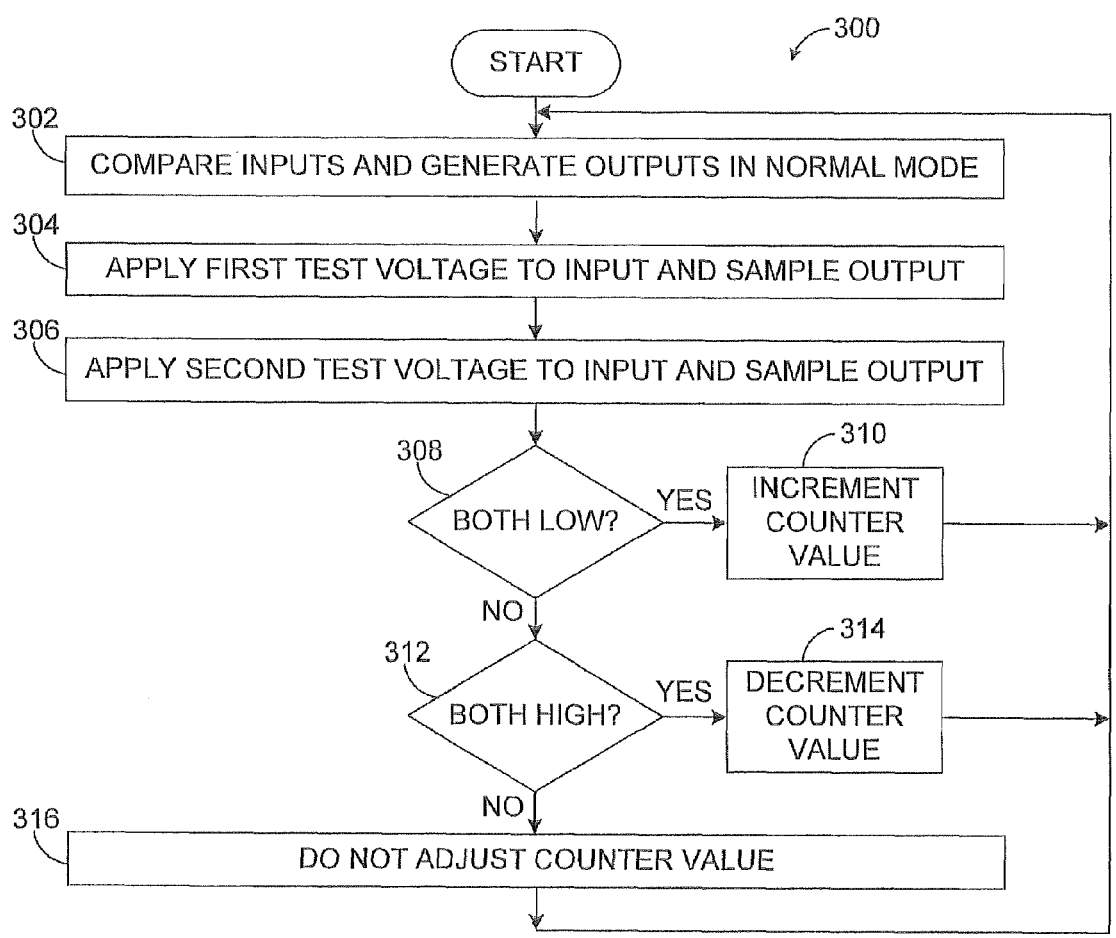
FIG. 3 illustrates an example method for offset cancellation of a sampled comparator in accordance with this disclosure.

FIGS. 2 through 3, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

FIG. 2 illustrates an example circuit 200 for offset cancellation of a sampled comparator in accordance with this disclosure. The embodiment of the circuit 200 shown in FIG. 2 is for illustration only. Other embodiments of the circuit 200 could be used without departing from the scope of this disclosure.

The circuit 200 includes a comparator 202. The comparator 202 compares two voltages received at its inputs and generates an output based on the comparison. For example, the comparator 202 could compare an input voltage (such as V−) received at its inverting input to a reference voltage (such as $V_{REF}$) received at its non-inverting input. The comparator 202 could then generate a high or low logic output based on whether the voltage at its inverting input is larger or smaller than the voltage at its non-inverting input. The comparator 202 includes any suitable structure for comparing voltages.

The output of the comparator 202 is provided to a digital integrator. In this example, the digital integrator is formed from two latches 204a-204b, an XOR gate 206, and a counter 208. The latches 204a-204b receive the output of the comparator 202 as an input, and the latches 204a-204b sample and hold the value of the output from the comparator 202. For example, the latches 204a-204b could sample the output of the comparator 202 at different times and output the sampled values (or inverted sampled values) to other components in the circuit 200. Each of the latches 204a-204b includes any suitable structure for sampling a signal and outputting a sampled value. In this particular example, the latches 204a-204b represent D flip-flops.

The non-inverted outputs of the latches 204a-204b are provided as inputs to the XOR gate 206, and the inverted output of the latch 204a is provided as an "up/down" input to the counter 208. The XOR gate 206 receives the two inputs, performs a logical XOR operation, and generates an output that is provided to the counter 208 as a "no count" input. The XOR gate 206 includes any suitable structure for performing logical XOR operations.

The counter 208 outputs a digital count value. The counter 208 also increments or decrements its count value based on the "up/down" input from the latch 204a. For example, the counter 208 may increment the count value when the "up/down" input is high and decrement the count value when the "up/down" input is low. In addition, the counter 208 may stop incrementing and decrementing its count value based on the "no count" input from the XOR gate 206. For instance, the counter 208 may not increment or decrement its count value when the "no count" input is high. The counter 208 includes any suitable structure for incrementing and decrementing a value.

A digital-to-analog converter (DAC) 210 receives the digital output of the counter 208 and generates a corresponding analog signal. The analog signal is provided to the comparator 202 as an analog offset correction signal. This analog offset correction signal may adjust the operation of the comparator 202 by compensating for offset in the comparator 202. The digital-to-analog converter 210 includes any suitable structure for converting a digital signal into a corresponding analog signal.

In this example, the circuit 200 also includes three resistors 212a-212c. The resistors 212a-212c are coupled in series between a current source 214 and ground. The resistors 212a-212c function as a voltage divider to produce different voltages. Each of the resistors 212a-212c may have any suitable resistance. Current flowing through the resistors 212a-212c is provided by the current source 214. The current source 214 represents any suitable source of current.

The current flowing through the resistors 212a-212c leads to the creation of three voltages used by the comparator 202. A voltage between the resistors 212a and 212b represents the reference voltage $V_{REF}$ used by the comparator 202 and received at its non-inverting input. A voltage before the resistor 212a represents a voltage that is higher than the reference voltage $V_{REF}$ (in this example, the difference is denoted $+V_{BAND}$). A voltage between the resistors 212b and 212c represents a voltage that is lower than the reference voltage $V_{REF}$ (in this example, the difference is denoted $-V_{BAND}$). In effect, the voltages $V_{REF}+V_{BAND}$ and $V_{REF}-V_{BAND}$ represent a band around the reference voltage $V_{REF}$.

As shown in FIG. 2, the reference voltage $V_{REF}$ is supplied to the non-inverting input of the comparator 202. The voltage provided to the inverting input of the comparator 202 is controlled using three switches 216a-216c. The switch 216a couples the voltage $V_{REF}+V_{BAND}$ to the comparator 202, and the switch 216b couples the voltage $V_{REF}-V_{BAND}$ to the comparator 202. The third switch 216c may couple the typical input voltage V− to the comparator 202. In this way, different voltages can be supplied to the comparator 202 during normal operation and during auto-zeroing of the comparator 202. Each of the switches 216a-216c represents any suitable structure for selectively coupling a voltage to a comparator input.

The switches 216a-216c are controlled by three control signals S1-S3. As shown in FIG. 2, the first control signal S1 controls the switch 216a and may have a relatively short pulse. Similarly, the second control signal S2 controls the switch 216b and may have a relatively short pulse. The third control signal S3 controls the switch 216c and may have a relatively long pulse. In this example, the pulse in the second control signal S2 occurs immediately after the pulse in the first control signal S1, and the pulse in the third control signal S3 occurs immediately after the pulse in the second control signal S2. However, the timing and the relative lengths of the pulses are for illustration only.

The control signals S1-S2 are also provided to two delay elements 218a-218b. A third delay element 218c delays the output of the delay element 218b, thereby delaying the control signal S2 twice. Each of the delay elements 218a-218c delays its respective input signal by a specified amount and then outputs the delayed signal to a destination. As shown in FIG. 2, the delayed control signal S1 is provided by the delay element 218a to the latch 204a as a clock signal. The delayed control signal S2 is provided by the delay element 218b to the latch 204b as a clock signal. The twice-delayed control signal S2 is provided by the delay element 218c to the counter 208 as a clock signal. The delays provided by the delay elements 218a-218c may help to account for the delay time of the comparator 202 and the delay time of other logic elements in the circuit 200.

In one aspect of operation, the comparator 202 may operate in a normal mode when the switch 216c is closed and the switches 216a-216b are open. In this mode, the comparator 202 operates to compare the input voltage V− to the reference voltage $V_{REF}$ and generate an output based on the comparison. Also, in this mode, the latches 204a-204b and the counter 208 may not be clocked, so the counter 208 continues to output the same value. This means the comparator 202 generally receives the same analog offset correction signal during this period.

During auto-zeroing, the switch 216c is open, and the switches 216a-216 are individually closed during different auto-zeroing cycles to provide the voltages $V_{REF}+V_{BAND}$ and $V_{REF}-V_{BAND}$ to the comparator 202. During one auto-zeroing cycle, the pulse in the control signal S1 closes the switch 216a and (at a later time because of the delay element 218a) clocks the latch 204a, causing the latch 204a to capture the output of the comparator 202 generated using the voltage $V_{REF}+V_{BAND}$. Similarly, during another auto-zeroing cycle, the pulse in the control signal S2 closes the switch 216b and also (at a later time because of the delay element 218b) clocks the latch 204b, causing the latch 204b to capture the output of the comparator 202 generated using the voltage $V_{REF}-V_{BAND}$.

After both latches 204a-204b have captured the outputs of the comparator 202, the twice-delayed pulse in the control signal S2 (produced by the delay element 218c) clocks the counter 208. This causes the counter 208 to adjust its output based on the inverted output of the latch 204a, unless the XOR gate 206 has disabled counting by the counter 208. The operation of the digital integrator in the circuit 200 is shown in more detail in FIG. 3, which is described below.

This functionality helps to reduce or eliminate offset in the comparator 202. Unlike conventional techniques, this technique overcomes digital oscillation by making use of two auto-zeroing cycles. In one auto-zeroing cycle, the higher voltage $V_{REF}+V_{BAND}$ is applied to the comparator 202. In the other auto-zeroing cycle, the lower voltage $V_{REF}-V_{BAND}$ is applied to the comparator 202. The results (as captured by the latches 204a-204b) are used by the digital integrator as described below to adjust the analog offset correction signal provided to the comparator 202. This causes the comparator 202 to be time-multiplexed as a window comparator, and its offset is forced within a band about zero (the band is defined by the values of $+V_{BAND}$ and $-V_{BAND}$). Once the offset of the comparator 202 is within this band, the counter 208 stops counting and does not adjust the offset further.

If, at some later time, the offset of the comparator 202 drifts out of the band, the offset can be forced back into the band. For example, periodic changes in temperature, bias, or stress on the comparator 202 may induce a drift. The circuit 200 could routinely apply the $V_{REF}+V_{BAND}$ and $V_{REF}-V_{BAND}$ voltages to the comparator 202 and analyze the results. If the offset of the comparator 202 remains within the band, the XOR gate 206 continues to disable counting by the counter 208. When the offset becomes too large, the XOR gate 206 stops disabling counting by the counter 208. At that point, the counter 208 can adjust its output, which adjusts the analog offset cancellation signal provided to the comparator 202. In this way, the circuit 200 can monitor the offset of the comparator 202 and adjust the comparator's offset cancellation signal when needed.

In some embodiments, the resistors 212a-212c may represent scaling matched resistors or other resistors such that the voltages $V_{REF}+V_{BAND}$ and $V_{REF}-V_{BAND}$ are slightly higher and slightly lower than the nominal comparator reference voltage $V_{REF}$. This may help to keep the comparator 202 biased near its normal common mode point and may help to eliminate the need for a wide input range front end to the comparator 202. Also, if the resistors 212a-212c match well, this may mean the offset band around the reference voltage $V_{REF}$ can scale as a constant percentage of a reference point. In addition, it could be possible to dynamically change the offset band around the reference voltage $V_{REF}$ and/or the reference voltage $V_{REF}$ itself, such as by dynamically adjusting the operation of the current source 214 or other elements generating the voltages.

In particular embodiments, the circuit 200 could form part of a larger circuit, device, or system. For example, the circuit 200 could reside on a printed circuit board or other substrate 220. The substrate 220 may represent any suitable carrier capable of supporting the circuit 200. The circuit 200 could also be coupled to a signal source 222. The signal source 222 may represent any suitable device, circuit, system, or other component capable of providing a signal to the comparator 202 for comparison to the reference voltage $V_{REF}$.

Although FIG. 2 illustrates one example of a circuit 200 for offset cancellation of a sampled comparator, various changes may be made to FIG. 2. For example, FIG. 2 shows that the pulses in the control signals S1-S2 occur next to each other (and therefore the second auto-zeroing cycle occurs immediately after the first cycle). However, the auto-zeroing cycles could be implemented on alternate clock cycles or at other non-adjacent times. Also, the voltages $V_{REF}+V_{BAND}$ and $V_{REF}-V_{BAND}$ can be applied in any suitable order during auto-zeroing, and these voltages and the reference voltage $V_{REF}$ can be generated in any suitable manner. Further, the inverted output of the latch 204b could be applied to the "up/down" input of the counter 208. In addition, other logic could be used to implement the functions performed by the circuit 200. As a particular example, an AND gate followed by an inverter could be used in place of the XOR gate 206. Although not functionally equivalent to an XOR gate, this combinatorial logic provides the desired output. As shown in FIG. 3 below (and based on the embodiment of the circuit 200 in FIG. 2), the counter 208 adjusts its output when the latches 204a-204b capture and output equal values during auto-zeroing. Therefore, any combinatorial logic that detects equal outputs from the latches 204a-204b could be used in place of the XOR gate 206.

FIG. 3 illustrates an example method 300 for offset cancellation of a sampled comparator in accordance with this disclosure. The embodiment of the method 300 shown in FIG. 3 is for illustration only. Other embodiments of the method 300 could be used without departing from the scope of this disclosure. Also, for ease of explanation, the method 300 is described with respect to the circuit 200 of FIG. 2. The method 300 could be used with any other suitable circuit, device, or system.

A comparator compares its inputs and generates its outputs in a normal mode of operation at step 302. This could include, for example, ensuring that the switches 216a-216b are open and that the switch 216c is closed. In this mode, the comparator 202 compares its typical input voltage V− and its typical reference voltage $V_{REF}$ and generates its outputs based on the comparison.

A first test voltage is applied to the comparator and the resulting output of the comparator is sampled at step 304. This could include, for example, opening the switch 216c and closing the switch 216a, which provides the voltage $V_{REF}+V_{BAND}$ to the comparator 202. The control signal that closes the switch 216a may also clock the latch 204a after a delay, thereby capturing the output of the comparator 202. Because the voltage $V_{REF}+V_{BAND}$ is applied to the inverting input of the comparator 202, this effectively creates a voltage difference of $-V_{BAND}$ between the positive and negative inputs of the comparator 202.

A second test voltage is applied to the comparator and the resulting output of the comparator is sampled at step 306. This could include, for example, opening the switch 216a and closing the switch 216b, which provides the voltage $V_{REF}-V_{BAND}$ to the comparator 202. The control signal that closes the switch 216b may also clock the latch 204b after a delay, thereby capturing the output of the comparator 202. Because the voltage $V_{REF}-V_{BAND}$ is applied to the inverting input of the comparator 202, this effectively creates a voltage difference of $+V_{BAND}$ between the positive and negative inputs of the comparator 202.

Steps 304-306 could occur at any suitable time. For example, these steps could occur during times when the comparator 202 is not being used for other purposes. Often times, the comparator 202 is used to compare signals, but the use of the comparator 202 is not continuous. Steps 304-306 could occur during breaks in the use of the comparator 202. However, steps 304-306 could occur at any other suitable time.

If both of the sampled outputs of the comparator are low at step 308, this indicates that the offset of the comparator 202 is negative with a magnitude greater than the value of $V_{BAND}$. A counter value is therefore incremented at step 310. This could include, for example, both latches 204a-204b outputting low logic values to the XOR gate 206, which outputs a low logic value to the "no count" input of the counter 208. This could also include the latch 204a outputting a high logic value (the inverted value captured from the comparator 202) to the "up/down" input of the counter 208. When this occurs, the low "no count" input allows the counter 208 to alter its output, and the high "up/down" input causes the counter 208 to increment its output. This causes the digital-to-analog converter 210 to generate a larger analog offset correction signal for the comparator 202.

If both of the sampled outputs of the comparator are high at step 312, this indicates that the offset of the comparator 202 is positive with a magnitude greater than the value of $V_{BAND}$. The counter value is therefore decremented at step 314. This could include, for example, both latches 204a-204b outputting high logic values to the XOR gate 206, which outputs a low logic value to the "no count" input of the counter 208. This could also include the latch 204a outputting a low logic value (the inverted value captured from the comparator 202) to the "up/down" input of the counter 208. When this occurs, the low "no count" input allows the counter 208 to alter its output, and the low "up/down" input causes the counter 208 to decrement its output. This causes the digital-to-analog converter 210 to generate a smaller analog offset correction signal for the comparator 202.

Otherwise, no change is made to the output of the counter at step 316. In this case, the offset of the comparator 202 is somewhere between $+V_{BAND}$ and $-V_{BAND}$. The latches 204a-204b capture and output different logic values, which causes the XOR gate 206 to generate a logical high value for the "no count" input of the counter 208. This causes the counter 208 to ignore the value at its "up/down" input from the latch 204a.

At this point, the method 300 returns to step 302 by reentering the normal mode of operation. This could involve opening the switch 216b and closing the switch 216c. The comparator 202 may then compare its inputs and generate its outputs in the normal mode of operation again. This process may continue throughout the operation of the comparator 202, helping to ensure that the offset of the comparator 202 remains within the specified range or band defined by $V_{BAND}$.

Although FIG. 3 illustrates one example of a method 300 for offset cancellation of a sampled comparator, various changes may be made to FIG. 3. For example, while shown as a series of steps, various steps could overlap or occur in a different order. As a particular example, the voltage $V_{REF}-V_{BAND}$ could be supplied to the comparator 202 before the voltage $V_{REF}+V_{BAND}$. Also, FIG. 3 shows that steps 304-316 occur only once before the comparator 202 resumes normal operation. However, steps 304-314 could occur repeatedly until the comparator offset is within the specified offset band, at which point the method 300 reaches step 316 and returns to step 302.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. An apparatus comprising:
a comparator operable to compare an input voltage and a reference voltage and to generate an output based on the comparison;
circuitry operable to provide a first test voltage and a second test voltage to the comparator, the test voltages defining a band around the reference voltage; and
an integrator operable to adjust an offset correction signal provided to the comparator based on outputs of the comparator that are generated using the test voltages.

2. The apparatus of claim 1, wherein:
the first test voltage is larger than the reference voltage; and
the second test voltage is smaller than the reference voltage.

3. The apparatus of claim 1, wherein the circuitry comprises:
a first switch operable to provide the first test voltage to an input of the comparator;
a second switch operable to provide the second test voltage to the input of the comparator; and
a third switch operable to provide the input voltage to the input of the comparator.

4. The apparatus of claim 3, wherein:
the first and second switches are open, the third switch is closed, and the input voltage is provided to the comparator during a normal mode of operation;
the first switch is closed, the second and third switches are open, and the first test voltage is provided to the comparator during a first auto-zeroing cycle; and
the second switch is closed, the first and third switches are open, and the second test voltage is provided to the comparator during a second auto-zeroing cycle.

5. The apparatus of claim 4, wherein the integrator comprises:
a first latch operable to sample the output of the comparator during the first auto-zeroing cycle;
a second latch operable to sample the output of the comparator during the second auto-zeroing cycle; and
a counter operable to increment or decrement a digital offset correction signal.

6. The apparatus of claim 5, wherein:
the counter is operable to increment or decrement the digital offset correction signal based on an inverted output from one of the latches; and
the integrator further comprises combinatorial logic operable to prevent the counter from incrementing or decrementing when the non-inverted outputs from the latches are not equal.

7. The apparatus of claim 5, further comprising a digital-to-analog converter operable to convert the digital offset correction signal into an analog offset correction signal that is provided to the comparator.

8. The apparatus of claim 5, further comprising:
a first delay element operable to delay a first control signal associated with the first switch and to provide the delayed first control signal to the first latch;
a second delay element operable to delay a second control signal associated with the second switch and to provide the delayed second control signal to the second latch; and
a third delay element operable to delay the delayed second control signal provided by the second delay element and to provide the twice-delayed second control signal to the counter.

9. The apparatus of claim 1, further comprising:
a current source; and
a plurality of resistors coupled in series between the current source and ground, the resistors operable to generate the reference voltage, the first test voltage, and the second test voltage.

10. A system comprising:
a signal source operable to provide an input voltage; and
circuitry for comparing the input voltage to a reference voltage, the circuitry comprising:
a comparator operable to compare the input voltage and the reference voltage and to generate an output based on the comparison;
voltage band circuitry operable to provide a first test voltage and a second test voltage to the comparator, the test voltages defining a band around the reference voltage; and
an integrator operable to adjust an offset correction signal provided to the comparator based on outputs of the comparator that are generated using the test voltages.

11. The system of claim 10, wherein:
the first test voltage is larger than the reference voltage; and
the second test voltage is smaller than the reference voltage.

12. The system of claim 10, wherein the voltage band circuitry comprises:
   a first switch operable to provide the first test voltage to an input of the comparator;
   a second switch operable to provide the second test voltage to the input of the comparator; and
   a third switch operable to provide the input voltage to the input of the comparator.

13. The system of claim 12, wherein:
   the first and second switches are open, the third switch is closed, and the input voltage is provided to the comparator during a normal mode of operation;
   the first switch is closed, the second and third switches are open, and the first test voltage is provided to the comparator during a first auto-zeroing cycle; and
   the second switch is closed, the first and third switches are open, and the second test voltage is provided to the comparator during a second auto-zeroing cycle.

14. The system of claim 13, wherein the integrator comprises:
   a first latch operable to sample the output of the comparator during the first auto-zeroing cycle;
   a second latch operable to sample the output of the comparator during the second auto-zeroing cycle; and
   a counter operable to increment or decrement a digital offset correction signal.

15. The system of claim 14, wherein:
   the counter is operable to increment or decrement the digital offset correction signal based on an inverted output from one of the latches; and
   the integrator further comprises combinatorial logic operable to prevent the counter from incrementing or decrementing when the non-inverted outputs from the latches are not equal.

16. The system of claim 14, wherein the circuitry further comprises a digital-to-analog converter operable to convert the digital offset correction signal into an analog offset correction signal that is provided to the comparator.

17. The system of claim 14, wherein the circuitry further comprises:
   a first delay element operable to delay a first control signal associated with the first switch and to provide the delayed first control signal to the first latch;
   a second delay element operable to delay a second control signal associated with the second switch and to provide the delayed second control signal to the second latch; and
   a third delay element operable to delay the delayed second control signal provided by the second delay element and to provide the twice-delayed second control signal to the counter.

18. A method comprising:
   providing a first test voltage and a second test voltage to a comparator, the comparator operable to compare the test voltages to a reference voltage;
   adjusting an offset correction signal provided to the comparator based on outputs of the comparator that are generated using the test voltages; and
   providing an input voltage to the comparator, the comparator operable to compare the input voltage and the reference voltage and to generate an output, the output based on the offset correction signal.

19. The method of claim 18, wherein adjusting the offset correction signal comprises:
   sampling, with a first latch, the output of the comparator generated using the first test voltage;
   sampling, with a second latch, the output of the comparator generated using the second test voltage;
   if the sampled outputs of both latches are equal, incrementing or decrementing a digital offset correction signal provided by a counter; and
   converting the incremented or decremented digital offset correction signal into an analog offset correction signal that is provided to the comparator.

20. The method of claim 19, wherein:
   providing the first test voltage to the comparator comprises closing a first switch based on a first control signal;
   providing the second test voltage to the comparator comprises closing a second switch based on a second control signal;
   providing the input voltage to the comparator comprises closing a third switch based on a third control signal; and
   the method further comprises:
      clocking the first latch with a delayed version of the first control signal;
      clocking the second latch with a delayed version of the second control signal; and
      clocking the counter with a twice-delayed version of the second control signal.

* * * * *